United States Patent
Saito

(10) Patent No.: US 6,486,507 B1
(45) Date of Patent: Nov. 26, 2002

(54) SPLIT GATE TYPE MEMORY CELL HAVING GATE INSULATING LAYERS APPROPRIATELY REGULATED IN THICKNESS AND PROCESS OF FABRICATION THEREOF

(75) Inventor: Kenji Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/257,298

(22) Filed: Feb. 25, 1999

(30) Foreign Application Priority Data

Feb. 27, 1998 (JP) .......................................... 10-048278

(51) Int. Cl.⁷ ............................................ H01L 29/788
(52) U.S. Cl. ...................... 257/315; 257/316; 257/317; 257/318
(58) Field of Search ................................. 257/315, 316, 257/317, 318, 319, 324; 438/201, 211, 257, 266, 260, 262

(56) References Cited

U.S. PATENT DOCUMENTS

| | | | | |
|---|---|---|---|---|
| 4,598,460 A | * | 7/1986 | Owens | 29/571 |
| 5,780,891 A | * | 7/1998 | Kauffman et al. | 257/316 |
| 6,054,348 A | * | 4/2000 | Lin | 438/257 |
| 6,107,670 A | * | 8/2000 | Masuda | 257/510 |
| 6,137,134 A | * | 10/2000 | Nakagawa | 257/316 |
| 6,144,064 A | * | 11/2000 | Cho | 257/321 |
| 6,246,088 B1 | * | 6/2001 | Chang | 257/314 |
| 6,246,089 B1 | * | 6/2001 | Lin et al. | 257/315 |
| 6,274,902 B1 | * | 8/2001 | Kauffman et al. | 257/316 |
| 6,281,545 B1 | * | 8/2001 | Liang et al. | 257/314 |
| 6,312,991 B1 | * | 11/2001 | Wang et al. | 257/315 |

FOREIGN PATENT DOCUMENTS

| | | | |
|---|---|---|---|
| JP | 406151873 A | * | 5/1994 |
| JP | 6-196714 | | 7/1994 |
| JP | 8-51164 | | 2/1996 |
| JP | 8-97304 | | 4/1996 |
| JP | 8-167706 | | 6/1996 |
| JP | 8-204034 | | 8/1996 |
| JP | 9-36257 | | 2/1997 |

* cited by examiner

Primary Examiner—Olik Chaudhuri
Assistant Examiner—Nathan W. Ha
(74) Attorney, Agent, or Firm—Sughrue Mion, PLLC

(57) ABSTRACT

A split gate type memory cell is a series combination of a stacked gate type memory transistor and a selecting field effect transistor, and the control gate insulating layer and the selecting gate oxide layer are to be thick and thin, respectively; an upper silicon oxide layer and the selecting gate oxide layer are thermally grown after deposition of a lower silicon oxide layer and a silicon nitride layer on the floating gate electrode, and the previous deposition of the lower silicon oxide layer/the silicon nitride layer and the thermal oxidation independently regulate the control gate insulating layer and the selecting gate oxide layer to appropriate thicknesses.

11 Claims, 9 Drawing Sheets

SPLIT GATE TYPE MEMORY CELL HAVING GATE INSULATING LAYERS APPROPRIATELY REGULATED IN THICKNESS AND PROCESS OF FABRICATION THEREOF

FIELD OF THE INVENTION

This invention relates to a semiconductor non-volatile memory device such as, for example, an electrically erasable and programmable read only memory device and, more particularly, to a split gate type memory cell of the semiconductor non-volatile memory device and a process of fabrication thereof.

DESCRIPTION OF THE RELATED ART

A stacked gate type memory transistor is a typical example of a semiconductor non-volatile memory transistor. The stacked gate type memory transistor has a floating gate over a channel region between the source/drain regions, and a gate insulting layer and a control gate are laminated on the floating gate. The stacked gate type memory transistor stores a data bit in the form of accumulated electrons injected into the floating gate electrode. If the electrons are injected into the floating gate electrode, the accumulated electrons induce holes in the channel region, and make the threshold of the stacked gate type memory transistor high. As a result, the stacked type memory transistor does not turn on under application of a read voltage to the control electrode. On the other hand, when the accumulated electrons are evacuated from the floating gate electrode, the threshold is lowered, and the read voltage causes the stacked type memory transistor to turn on. Thus, the stacked type memory transistor takes two kinds of state depending upon the amount of accumulated electrons, and two logic levels of a data bit are respectively corresponding to the two kinds of state. In the following description, one of the two kinds of state accumulating a large amount of electrons and the other kinds of state accumulating a small amount of electrons are hereinbelow referred to as "write-in state" and "erased state", respectively.

The stacked gate type memory transistor is connected in series to a standard field effect transistor, and form in combination a split gate type non-volatile memory cell. The split gate type non-volatile memory cell is effective against over-erased state. If the accumulated electrons are excessively erased from the floating gate electrode, the stacked gate type memory transistor enters into the depletion state, and is not appropriate to store a data bit. The split gate type memory cell is well known to a person skilled in the art, and no further description is incorporated hereinbelow.

The split gate type memory cell is fabricated as follows. FIGS. 1A to 1E illustrate the prior art process for fabricating the split gate type memory cell. FIG. 1E shows the structure along a cross section perpendicular to the cross section for FIGS. 1A to 1D. The process starts with preparation of a p-type silicon substrate 1. Boron is ion implanted into a certain area assigned to the split gate type memory cells at dosage of 3E13 atom/square-cm for adjusting channel dopant concentration to a target value, and, thereafter, arsenic is selectively ion implanted into the area for forming striped impurity regions 2a/2b as shown in FIG. 1A. The striped impurity regions 2a/2b serve as digital lines, and parts of the digit line serve as n-type source/drain regions of a split gate type memory cell.

Silicon oxide is deposited over the entire surface of the p-type silicon substrate 1 by using a chemical vapor deposition, and the silicon oxide layer is selectively etched away in order to expose active areas of the p-type silicon substrate 1. The remaining silicon oxide layer serves as an isolating oxide layer 3 (see FIG. 2).

Subsequently, the active areas are thermally oxidized, and a silicon oxide layer is grown to 20 nanometers thick on the active areas. Polysilicon is deposited over the entire surface of the resultant semiconductor structure, and a photo-resist etching mask (not shown) is provided on the polysilicon layer through photo-lithographic techniques. Using the photo-resist etching mask, the polysilicon layer and the silicon oxide layer are selectively etched away, and lower gate oxide layers 4 and floating gate electrodes 5 are formed on the active areas as shown in FIG. 1B. Each of the striped impurity regions 2a/2b is partially overlapped with the lower gate insulating layer 4, which is spaced from the other striped impurity region 2b/2a.

Subsequently, silicon oxide is deposited to 20 nanometers thick over the entire surface of the resultant semiconductor structure by using a chemical vapor deposition, and forms a silicon oxide layer 6. The resultant semiconductor structure is heated so that a silicon oxide layer 7 is grown to 20 to 30 nanometers thick on the entire surfaces of the floating gate electrodes 5 and the active areas between the floating gate electrodes 5. The polysilicon is oxidized half as fast again as the single crystal silicon, and, for this reason, the silicon oxide layer 7 on the floating gate electrodes 5 is half as thick again as the silicon oxide layer 7 on the active areas.

Subsequently, polysilicon is deposited over the entire surface of the resultant semiconductor structure by using the chemical vapor deposition, and a polysilicon layer is formed on the silicon oxide layer 7. Silicon oxide is deposited to 250 nanometers thick over the entire surface of the polysilicon layer by using the chemical vapor deposition, and a silicon oxide layer is laminated on the polysilicon layer. A photo-resist etching mask (not shown) is patterned on the silicon oxide layer, and has striped masking portions extending in the perpendicular direction to the striped impurity regions 2a/2b. Using the photo-resist etching mask, the silicon oxide layer and the polysilicon layer are selectively etched away, and composite gate electrodes 8 and upper insulating layers 9 as shown in FIG. 1D.

The composite gate electrode partially serves as control gate electrodes 10 of the stacked gate type memory transistors and partially as selecting gate electrodes 11 of the associated field effect transistors. Accordingly, the silicon oxide layers 6/7 under the control gate electrodes serve as upper gate oxide layers of the stacked gate type memory transistors, and the silicon oxide layers 6/7 under the selecting gate electrodes serve as gate oxide layers of the associated field effect transistors.

Subsequently, silicon oxide is deposited to 100 nanometers thick over the entire surface of the resultant semiconductor structure, and the silicon oxide layer is anisotropically etched without any etching mask. Side walls 12 are left on the side surfaces of the control gate electrodes 10 and the selecting gate electrodes 11. The silicon oxide layers 6/7 are exposed to gaps between the side walls 12. The silicon oxide layers 6/7 and the floating gate electrodes exposed to the gaps are etched away, and the isolating oxide layer 3 and side surfaces of the floating gate electrodes 5 are exposed to the gaps. Easing gate oxide layers 13 are grown to 20 nanometers thick on the side surfaces of the floating gate electrodes 5.

Polysilicon is deposited over the entire surface of the resultant semiconductor structure. The polysilicon fills the gaps between the side walls 12, and a polysilicon layer is spread over the silicon oxide layer 9. Using a photo-resist etching mask, the polysilicon layer is patterned into erasing gate electrodes 14, and the erasing gate electrodes 14 are held in contact with the erasing gate oxide layers 13 as shown in FIG. 1E. The erasing gate electrodes 14 occupy every other gaps between the side walls 12.

Though not shown in the drawings, the resultant semiconductor structure is covered with an inter-level insulating layer, and conductive lines are formed on the inter-level insulating layer in such a manner as to be connected through contact holes in the inter-level insulating layer to appropriate conductive portions.

In order to increase the data storing capacity of the prior art semiconductor non-volatile memory device, it is necessary to scale down the split gate type memory cell. This means that both of the stacked gate type memory transistor and the selecting transistor are scaled down. When the selecting transistor is scaled down, it is appropriate to decrease the threshold of the selecting transistor, and the manufacturer makes the silicon oxide layers 6/7 under the selecting gate electrode 11 thinner. Although the silicon oxide layers 6/7 between the floating gate electrode 5 and the control gate electrode 10 is half as thick again as the silicon oxide layers 6/7 under the selecting gate electrode 11, the silicon oxide layers 6/7 between the floating gate electrode 5 and the control gate electrode 10 also becomes thinner, because the silicon oxide layers 6/7 are concurrently deposited for those purposes. However, such thin silicon oxide layers 6/7 between the floating gate electrode 5 and the control gate electrode 10 allow a large amount of leakage current to flow through the silicon oxide layers 6/7 between the floating gate electrode 5 and the control gate electrode 10. Thus, the reduction of the thickness results in low reliability of stacked gate type memory transistor.

Japanese Patent Publication of Unexamined Application No. 8-204034 discloses a process for fabricating a split gate type memory cell where the insulating layer between the floating gate electrode and the control gate electrode and the gate oxide layer under the selecting gate electrode are independently grown. According to the Japanese Patent Publication of Unexamined Application, a polysilicon layer over a silicon substrate is selectively oxidized by using the LOCOS (local oxidation of silicon) technique, and the silicon oxide forms a thick control gate oxide layer. Sharp edges take place at both sides of the control gate oxide layer due to the bird's beaks during the LOCOS, and, accordingly, the floating gate electrode is sharpened at both sides of the upper portion. Using the thick control gate oxide layer as an etching mask, the polysilicon layer is patterned into a floating gate electrode. Side walls are formed on side surfaces of the floating gate electrode, and the silicon substrate is exposed on both sides of the side walls. The resultant semiconductor structure is covered with silicon oxide layers, and the silicon oxide layers serve as a gate oxide layer for a selecting transistor on the silicon substrate. A control gate electrode is patterned on the silicon oxide layers in such a manner as to be partially overlapped with the floating gate electrode. Finally, dopant impurity is ion implanted into the silicon substrate in self-aligned manner with the control gate electrode and the side wall. The sharp edges of the floating gate electrode are desirable for evacuation of accumulating electron from the floating gate electrode to the control gate electrode, because tunneling current is much liable to flow from the sharp edges.

The control gate oxide layer and the gate oxide layer for the selecting transistor are independently grown, and the manufacturer appropriately determines the thickness of the control gate oxide layer and the thickness of the gate oxide layer of the selecting transistor. However, the prior art process disclosed in the Japanese Patent Publication of Unexamined Application is hardly applied to the prior art process shown in FIGS. 1A to 1E.

The first reason is the location of the control gate electrode. The control gate is opposed to the sharp edge or the bird's beak produced through the LOCOS process. The sharp edge aims at the easy initiation of tunneling current during the erasing operation, and the control gate electrode is expected to extend over the sharp edge of the floating gate electrode. For this reason, the control gate electrode is patterned on the side wall, and both ends of the control gate electrode are on the gate oxide layer of the selecting transistor and on the control gate oxide layer over the upper surface of the floating gate electrode. The source/drain regions has to be formed after the patterning of the control gate electrode in order to be self-aligned with the control gate electrode. On the other hand, the prior art process shown in FIGS. 1A to 1E has a premise that the striped impurity regions 2a/2b are partially overlapped with the floating gate electrode 5. The source/drain regions self-aligned with the control gate electrode consumes wide real estate, and is not desirable for a large data storage capacity.

The second reason is undesirable prolongation of the etching for exposing the side surfaces of the floating gate electrode 5. As described hereinbefore, the prior art split gate type memory cell requires the erasing electrode 14, and the erasing electrode 14 is opposed to the side surface of the floating gate electrode 5 through the erasing gate oxide layer 13. If the floating gate electrode 5 is covered with a thick silicon oxide grown through the LOCOS, the etching consumes long time until the side surfaces are exposed. Thus, the thick silicon oxide layer grown through the LOCOS reduces the throughput of the etching system.

The third reason is non-uniform erasing gate oxide layer 13. The oxidation tends to proceed at high speed immediately under the control gate oxide layer 6/7. The easing gate oxide layer 13 is thick in the vicinity of the control gate electrode 6/7 and the isolating layer 3 and thin therebetween as shown in FIG. 2. The non-uniform erasing gate oxide layer 13 makes the erasing characteristics unstable, and the thick silicon oxide layer grown through the LOCOS is undesirable.

Thus, the prior art process disclosed in the Japanese Patent Publication of Unexamined Application is featured by the bird's beak opposed to the control gate, and is less combined to the prior art process shown in FIGS. 1A to 1E.

SUMMARY OF THE INVENTION

It is therefore an important object of the present invention to provide a semiconductor non-volatile memory device, the sprit gate type memory cell of white has a control gate insulating layer and a selecting gate insulating layer both having respective appropriate thickness.

It is also an important object of the present invention to provide a process for fabricating the sprit gate type memory cell.

To accomplish the object, the present invention proposes to form a part of a control gate insulating layer of silicon nitride.

In accordance with one aspect of the present invention, there is provided a semiconductor non-volatile memory device having a split gate type memory cell assigned to an active region on a semiconductor substrate, the split gate type memory cell, and the split gate type memory cell comprises a stacked gate type memory transistor including a first impurity region formed in a first sub-region of the active region, a first gate insulating layer covering a part of the first impurity region and a second sub-region of the active region adjacent to the first sub-region, a floating gate electrode formed on the first gate insulating layer, a second gate insulating layer having a first thickness and including a first insulating sub-layer formed of a first insulating material on an upper surface of the floating gate electrode and a second insulating sub-layer formed of silicon nitride on the first insulating sub-layer and a control gate electrode formed on the second gate insulating layer, and a selecting transistor including a second impurity region formed in a third sub-region of the active region spaced from the second sub-region, a third gate insulating layer having a second thickness less than the first thickness and formed of a second insulating material on at least a fourth sub-region of the active region between the third sub-region and the second sub-region and a selecting gate electrode connected to the control electrode and formed on the third gate insulating layer.

In accordance with another aspect of the present invention, there is provided a process for fabricating a split gate type memory cell on an active region of a semiconductor substrate, and the process comprises the steps of forming a first impurity region and a second impurity region spaced from each other in the active region, covering a part of the first impurity region and a sub-region of the active region adjacent to the first impurity region with a first gate insulating layer, successively depositing a first conductive material, a first insulating material and silicon nitride for forming a first conductive material layer, a first insulating material layer and a silicon nitride layer on the first gate insulating layer, patterning the first conductive material layer, the first insulating material layer and the silicon nitride layer into a first conductive stripe, a first insulating sub-layer laminated on the first conductive stripe and a second insulating sub-layer laminated on the first insulating sub-layer, covering the second insulating sub-layer and another sub-region of the active region adjacent to the sub-region with a second insulating layer of a second insulating material for forming a second gate insulating layer on the first conductive stripe and a third gate insulating layer on the another subregion, forming a second conductive stripe of a second conductive material extending over the second gate insulating layer and the third gate insulating layer for providing a control gate electrode on the second gate insulating layer and a selecting gate electrode on the third gate insulating layer, and selectively etching the first conductive stripe for forming a floating gate electrode between the first gate insulating layer and the second gate insulating layer.

BRIEF DESCRIPTION OF THE DRAWINGS

The features and advantages of the semiconductor non-volatile memory device and the process of fabrication thereof will be more clearly understood from the following description taken in conjunction with the accompanying drawings in which.

DESCRIPTION OF THE PREFERRED EMBODIMENT

Figure 1A:
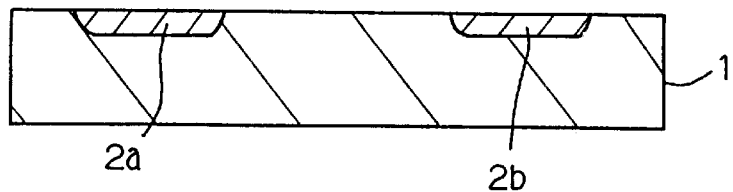
FIGS. 1A to 1E are cross sectional views showing the prior art process for fabricating the split gate type memory cell.
Figure 1B:
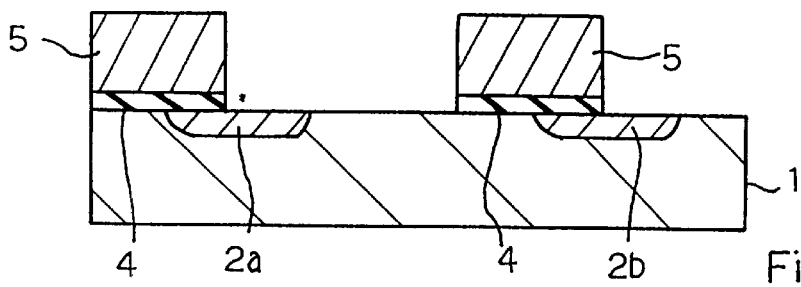
Figure 1C:
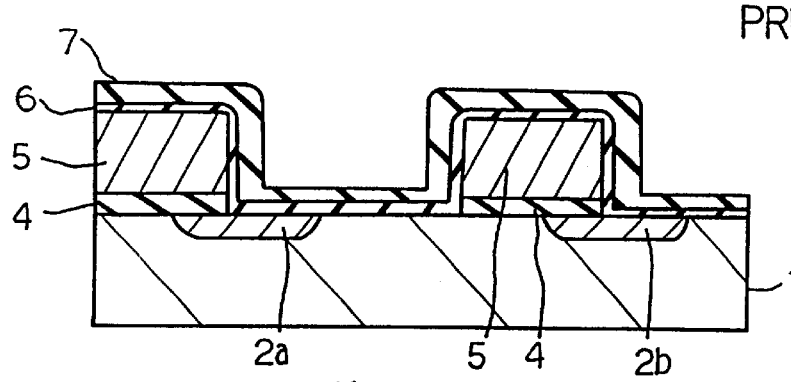
Figure 1D:
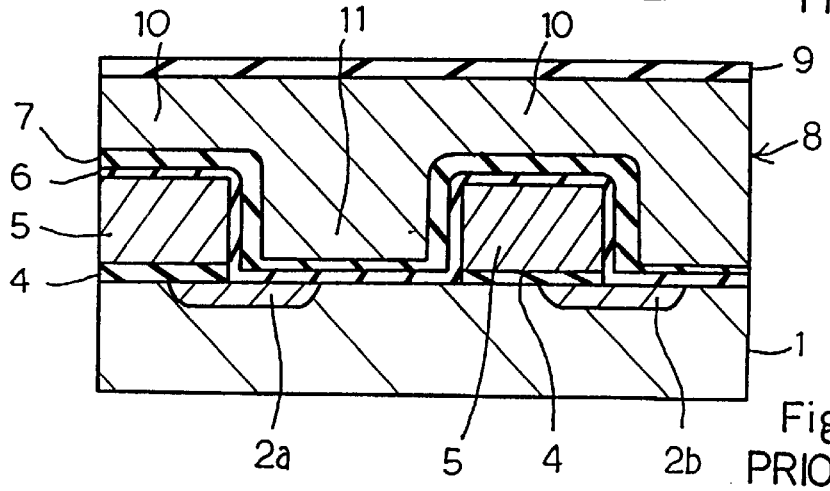
Figure 1E:
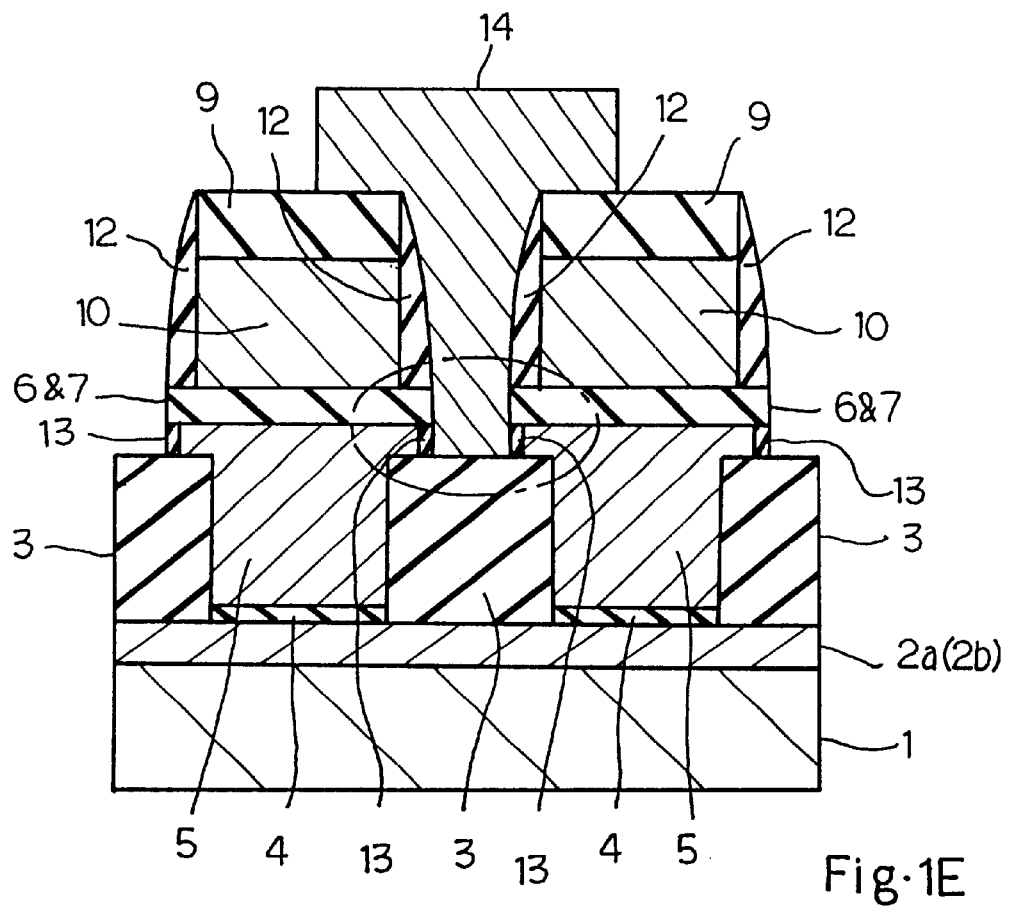
Figure 2:
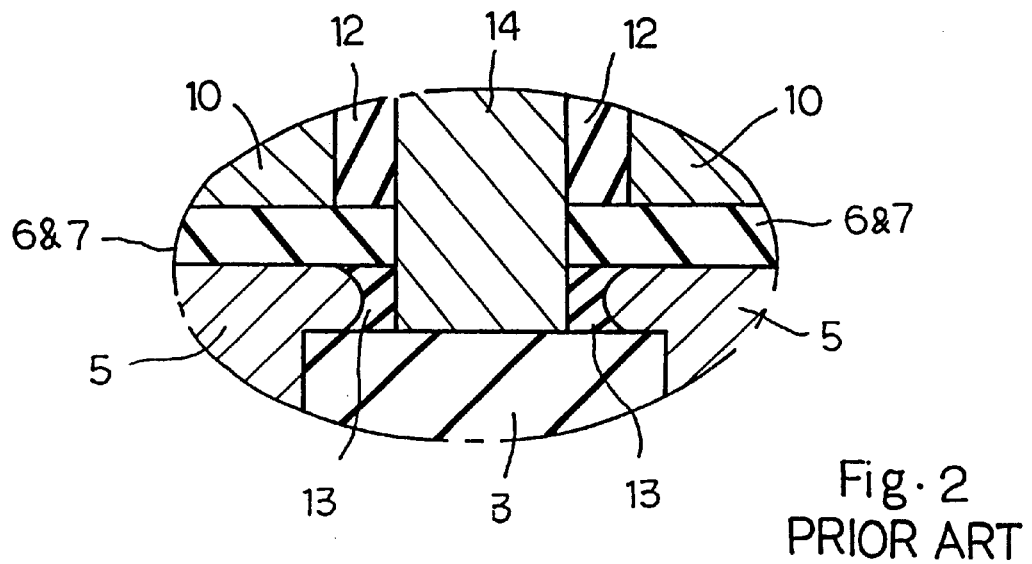
FIG. 2 is a cross sectional view showing the part of the prior art stacked gate type memory transistor encircled in dot-and-dash line and fabricated through the prior art process disclosed in Japanese Patent Publication of Unexamined Application No. 8-204043.
Figure 3A:
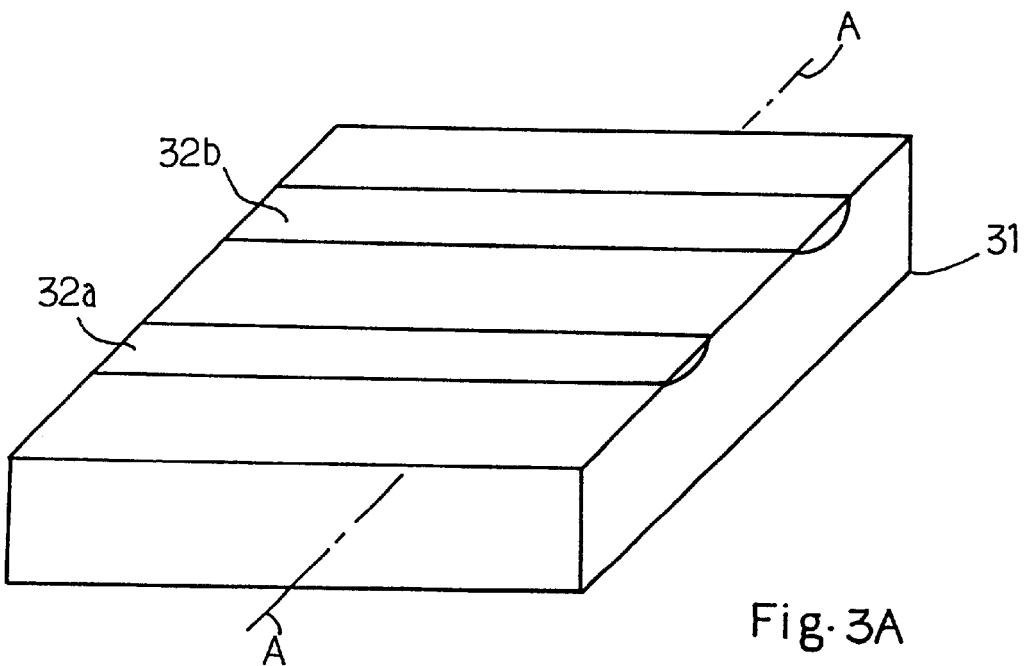
FIG. 3A is a perspective view showing a step of a process for fabricating a split gate type memory cell according to the present invention.
Figure 3B:
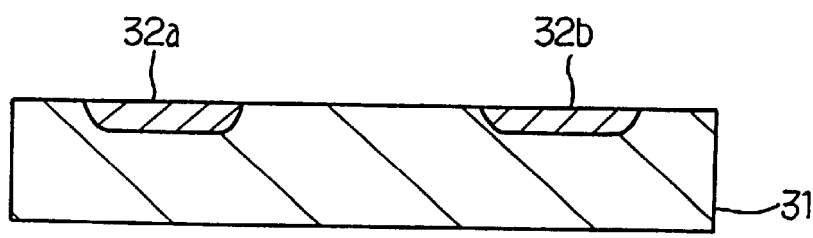
FIG. 3B is a cross sectional view taken along line A—A of FIG. 3A.

Referring to FIGS. 3A and 3B of the drawings, a process embodying the present invention starts with preparation of a p-type silicon substrate 31. Boron is ion implanted into an area assigned to sprit gate type memory cells at dosage of 3E13 atom/square-cm, and the ion-implanted boron regulates channel dopant concentration to a target value.

Subsequently, photo-resist solution is spread over the entire surface of the p-type silicon substrate 31, and is baked for forming a photo-resist layer. A striped pattern image is transferred from a photo-mask (not shown) to the photo-resist layer, and forms a latent image in the photo-mask. The latent image is developed, and the photo-resist layer is patterned into a striped photo-resist ion-implantation mask (not show) on the p-type silicon substrate 31. Thus, the photo-resist ion-implantation mask is formed on the p-type silicon substrate 31 by using the photo-lithographic techniques.

Using the photo-resist ion-implantation mask, arsenic is ion implanted into the p-type silicon substrate 31 at a large dosage, and the ion-implanted arsenic forms heavily-doped n-type striped regions 32*a*/32*b* as shown in FIGS. 3A and 3B. The heavily-doped n-type striped regions 32*a*/32*b* serve as digit lines, and provide source/drain regions of the split gate type memory cells. The photo-resist ion-implantation mask is stripped off.

Figure 4A:
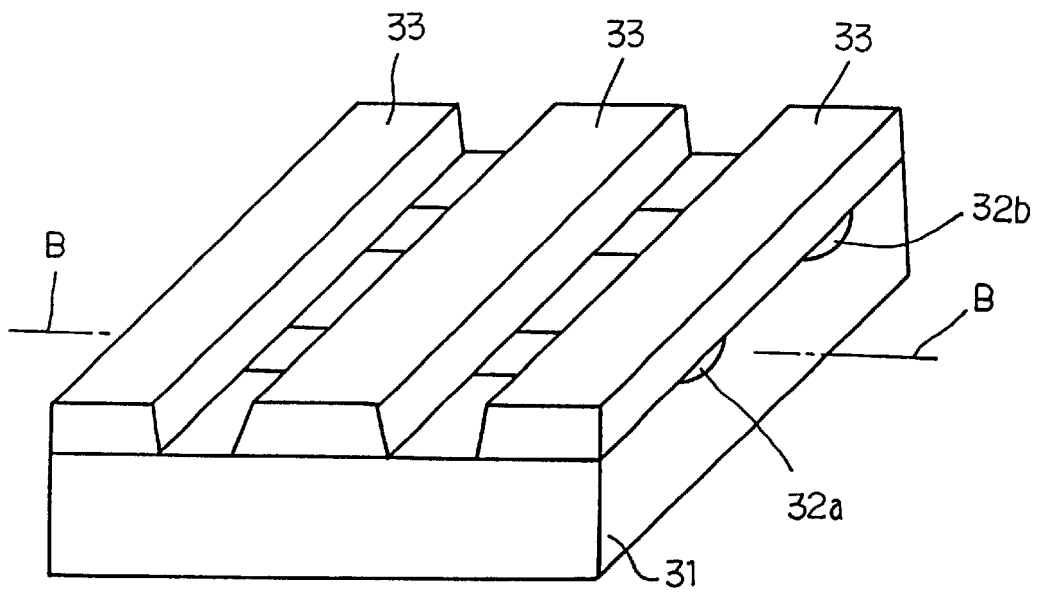
FIG. 4A is a perspective view showing another step of the process next to the step shown in FIG. 3A.
Figure 4B:
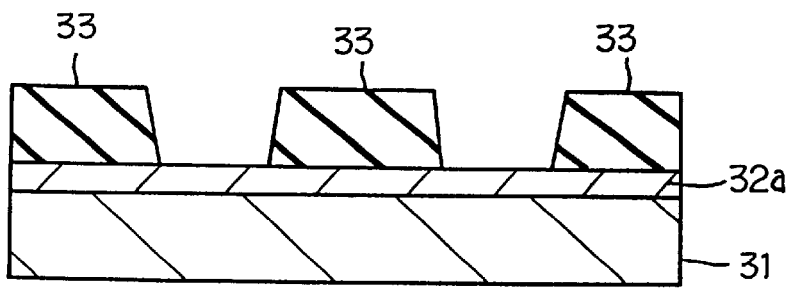
FIG. 4B is a cross sectional view taken along line B—B of FIG. 4A.

Subsequently, silicon oxide is deposited to 300 nanometers thick over the entire surface of the p-type silicon substrate 31 by using a chemical vapor deposition, and forms a silicon oxide layer on the p-type silicon substrate 31. A photo-resist etching mask (not shown) is formed on the silicon oxide layer by using the photo-lithographic techniques, and has a striped pattern extending in the perpendicular direction to the heavily-doped n-type striped regions 32a/32b. Using the photo-resist etching mask, the silicon oxide layer is selectively etched away, and isolating oxide layers 33 are formed on the p-type silicon substrate 31 like stripes. The heavily-doped n-type striped regions 32a/32b are partially exposed to gaps between the isolating oxide layers 33 as shown in FIGS. 4A and 4B. The photo-resist etching mask is stripped off.

The surface of the p-type silicon substrate 31 exposed to the gaps is thermally oxidized, and silicon oxide is grown to 20 nanometers thick on the exposed surface of the p-type silicon substrate 31. The exposed surface is covered with a lower silicon oxide layer. Subsequently, polysilicon is deposited to 250 nanometers thick over the entire surface of the resultant semiconductor structure, and the silicon oxide layer and the isolating oxide layers are covered with a polysilicon layer. Silicon oxide is deposited to 5–10 nanometers thick over the polysilicon layer by using a chemical vapor deposition, and silicon nitride is further deposited to 200–300 nanometers thick over the silicon oxide layer. Thus, an upper silicon oxide layer and a silicon nitride layer are laminated on the polysilicon layer.

Figure 5A:
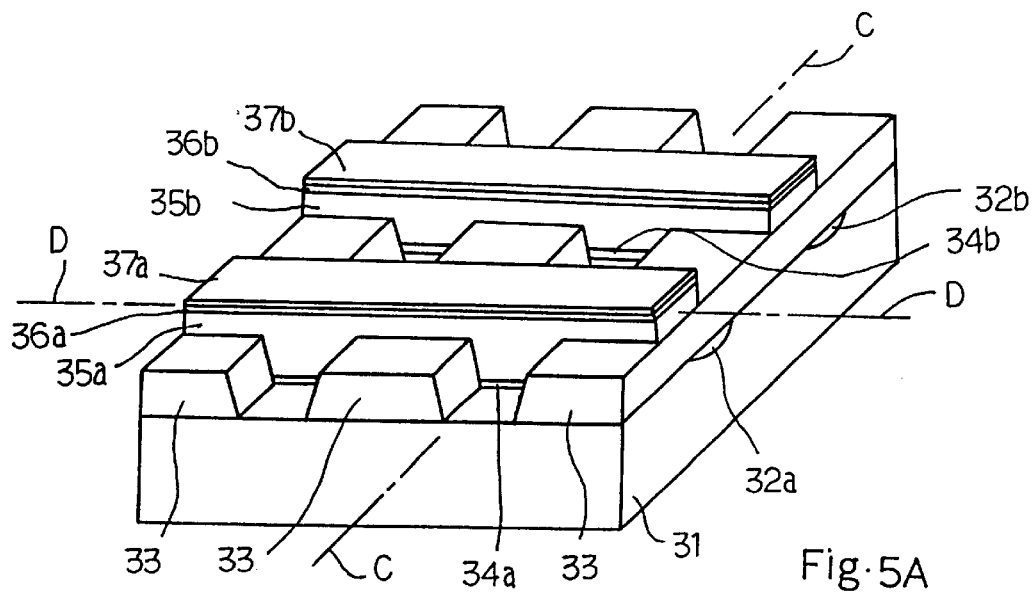
FIG. 5A is a perspective view showing yet another step of the process next to the step shown in FIG. 4A.
Figure 5B:
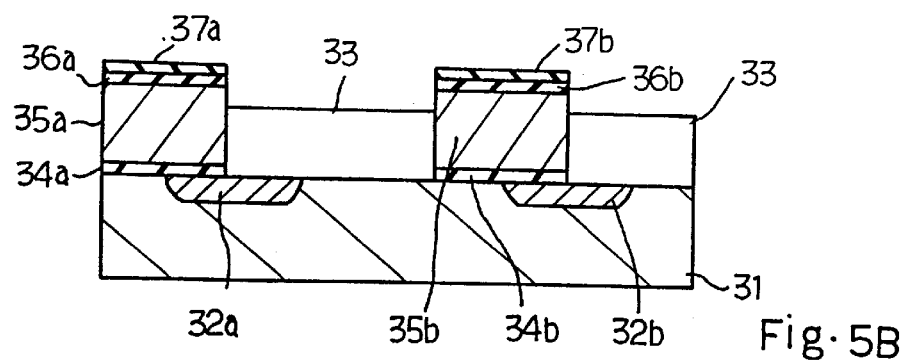
FIGS. 5B and 5C are cross sectional view taken along line C—C and line D—D of FIG. 5A, respectively.
Figure 5C:
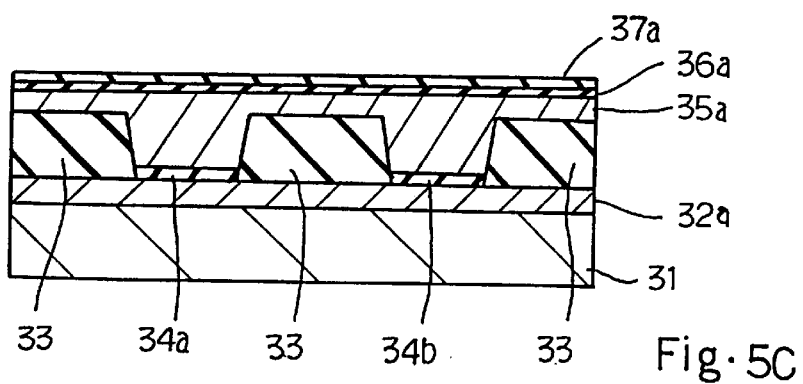

A photo-resist etching mask (not shown) is formed on the silicon nitride layer by using the photo-lithographic techniques. The photo-resist etching mask has a striped pattern extending in parallel to the heavily-doped n-type striped regions 32a/32b, and are offset therefrom. Using the photo-resist etching mask, the silicon nitride layer, the upper silicon oxide layer, the poly-silicon layer and the lower silicon oxide layer are anisotropically etched away, and floating gate oxide layers 34a/34b, polysilicon stripes 35a/35b, silicon oxide stripes 36a/36b and silicon nitride stripes 37a/37b are left on the exposed surface of the p-type silicon substrate 31 and the isolating oxide layers 33 as shown in FIGS. 5A, 5B and 5C. Thus, only one photo-resist etching mask is required for patterning the upper silicon oxide layer, the silicon nitride layer, the polysilicon layer and the lower silicon oxide layer, and the patterning step makes the process embodying the present invention simple. The photo-resist etching mask is stripped off.

The polysilicon stripe 35a, the silicon oxide stripe 36a and the silicon nitride stripe 37a are successively laminated on the floating gate oxide layer 34a, and form a laminated structure. Similarly, the polysilicon stripe 35b, the silicon oxide stripe 36b and the silicon nitride stripe 37b are successively laminated on the floating gate oxide layer 34b, and form another laminated structure. The laminated structures extend in parallel to the heavily-doped n-type striped regions 22a/32b, and are offset therefrom. For this reason, the laminated structures are partially on the heavily-doped n-type striped regions 32a/32b and partially on the exposed surface of the p-type silicon substrate 31.

Figure 6A:
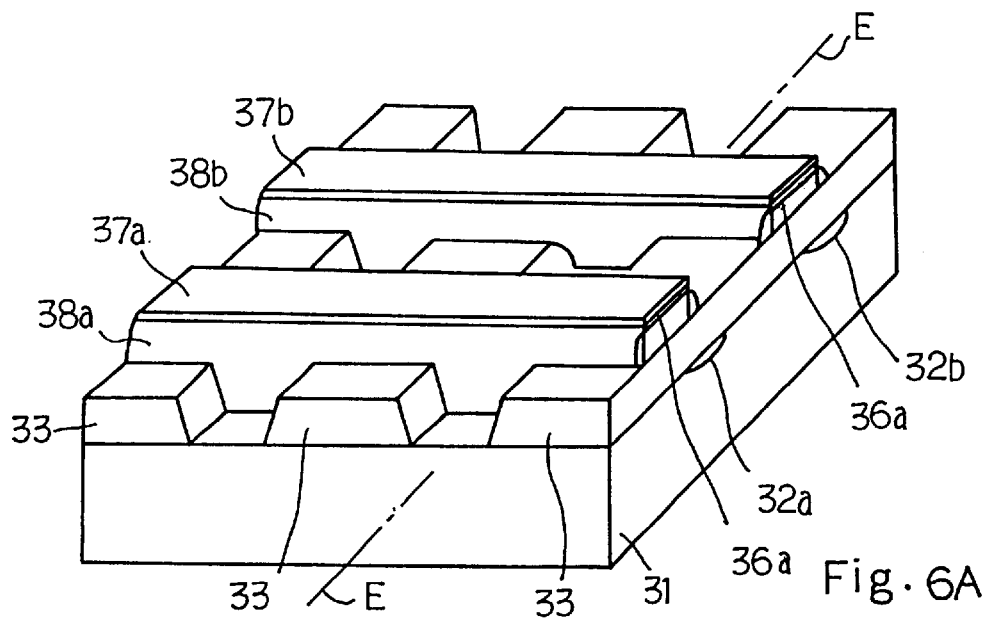
FIG. 6A is a perspective view showing still another step of the process next to the step shown in FIG. 4A.
Figure 6B:
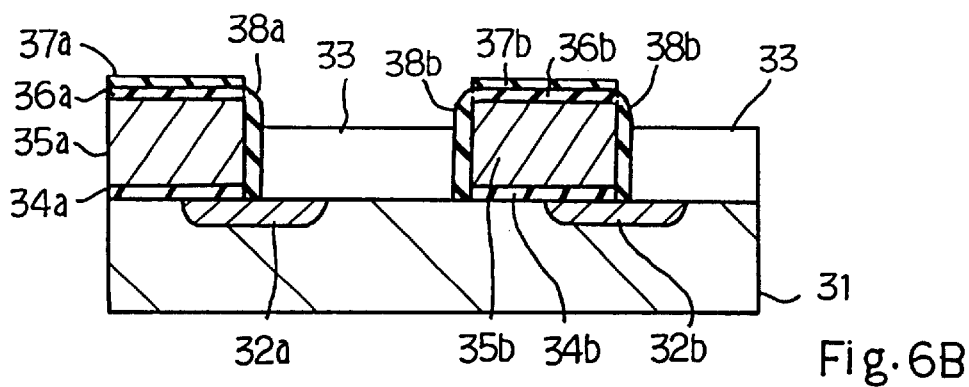
FIG. 6B is a cross sectional view taken along line E—E of FIG. 6A.

Subsequently, silicon oxide is deposited to 20 nanometers thick over the entire surface of the resultant semiconductor structure by using the chemical vapor deposition, and the resultant semiconductor structure is covered with a silicon oxide layer. The silicon oxide layer is anisotropically etched away without any etching mask until the silicon nitride stripes 37a/37b and the p-type silicon substrate 31 are exposed, again, and side walls 38a/38b are left on the side surfaces of the laminated structures as shown in FIGS. 6A and 6B.

Figure 7:
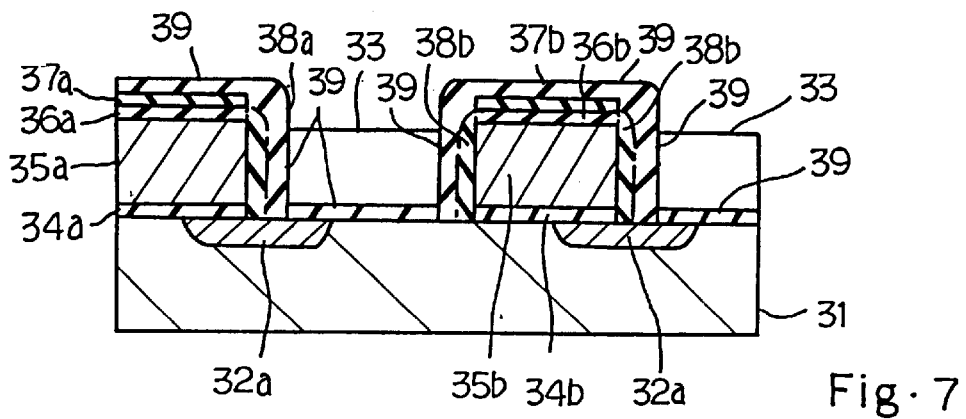
FIG. 7 is a cross sectional view showing, still another step of the process next to the step shown in FIG. 6B.

Subsequently, the exposed surface of the p-type silicon substrate 31 and the polysilicon stripes 35a/35b are thermally oxidized, and silicon oxide is grown. Oxygen atoms penetrate the side walls 38a/38b and the silicon oxide layer now grown on the p-type silicon substrate 31, and react with silicon atoms of the polysilicon stripes 35a/35b and silicon atoms of the p-type silicon substrate 31, and a silicon oxide layer 39 is grown on the exposed surface of the p-type silicon substrate 31 and the side walls 38a/38b. The silicon oxide layer 39 spreads over the silicon nitride stripes 37a/37b, and the silicon nitride stripes 37a/37b are covered with the silicon oxide layer 39 as shown in FIG. 7. The silicon oxide layer 39 on the p-type silicon substrate 31 is 10–15 nanometers thick. However, the silicon oxide layer 39 on the silicon nitride stripes 37a/37b are much thinner than the silicon oxide layer 39 on the p-type silicon substrate 31. Thus, the silicon oxide layer 39 on the p-type silicon substrate 31 is adjusted to the appropriate thickness regardless of the composite insulating layers 36a/37a/39 and 36b/37b/39 on the polysilicon stripes 35a/35b for floating gate electrodes.

Figure 8A:
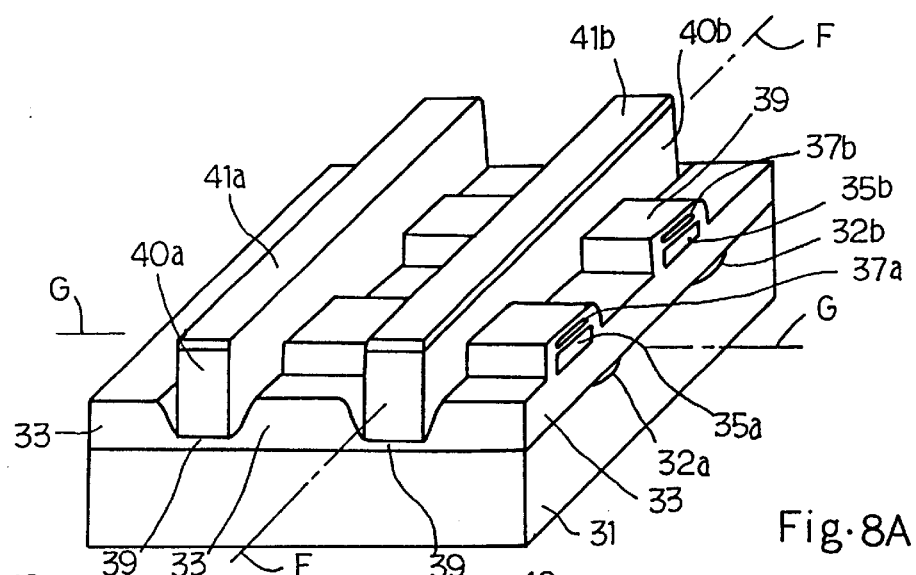
FIG. 8A is a perspective view showing still another step of the process next to the step shown in FIG. 7.
Figure 8B:
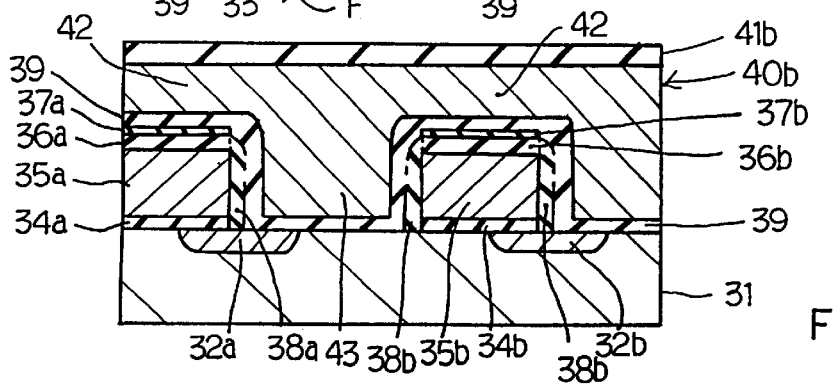
FIGS. 8B and 8C are cross sectional views taken along line F—F and G—G of FIG. 8A, respectively.
Figure 8C:
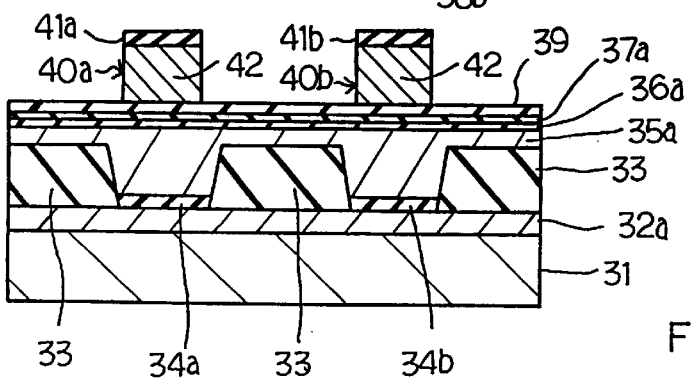

Subsequently, polysilicon is deposited to 250 nanometers thick over the entire surface of the resultant semiconductor structure, and forms a polysilicon layer. Silicon oxide is deposited to 250 nanometers thick over the poly-silicon layer by using the chemical vapor deposition, and a silicon oxide layer is laminated on the polysilicon layer. A photo-resist etching mask (not shown) is formed on the silicon oxide layer by using the photo-lithographic techniques, and has a striped pattern extending in parallel to the isolating oxide layers 33. Using the photo-resist etching mask, the silicon oxide layer and the polysilicon layer are selectively etched away, and polysilicon stripes 40a/40b and silicon oxide stripes 41a/41b are left between the isolating oxide layers 33 as shown in FIGS. 8A, 8B and 8C. The photo-resist etching mask is stripped off.

The polysilicon stripes 40a/40b over the silicon nitride stripes 37a/37b serve as control gate electrodes 42 of stacked gate type memory transistors, and the polysilicon stripes 40a/40b over the exposed surface of the p-type silicon substrate 31 serve as selecting gate electrodes 43 of field effect transistors. The silicon oxide layer 39 provides gate insulating layers beneath the selecting gate electrodes for the field effect transistors, and the composite insulating layer, i.e., the silicon oxide stripe 36a/36b, the silicon nitride stripe 37a/37b and the silicon oxide layer 39 serve as control gate insulating layer of each stacked gate type memory transistor.

As described hereinbefore, the gate insulating layer of the field effect transistor is adjusted to the appropriate thickness through the thermal oxidation. However, the silicon oxide stripe 36a/36b and the silicon nitride stripe 37a/37b have been already formed on the polysilicon stripe 35a/35b for floating gate electrodes before the thermal oxidation, and the thickness of the control gate insulating layer is equivalent to the total thickness of the silicon oxide stripe 36a/36b, the silicon nitride stripe 37a/37b and the silicon oxide layer 39. Thus, the control gate insulating layer is thick enough to restrict the leakage current between the control gate electrode 42 and the associated floating gate electrode. The manufacturer determines the thickness of the silicon oxide stripe 36a/36b and the thickness of the silicon nitride stripe 37a/37b without any dependence on the silicon oxide layer 39, and the control gate insulating layer of the stacked gate type memory transistor and the gate insulating layer of the field effect transistor have the appropriate values of thickness, respectively.

Figure 9A:
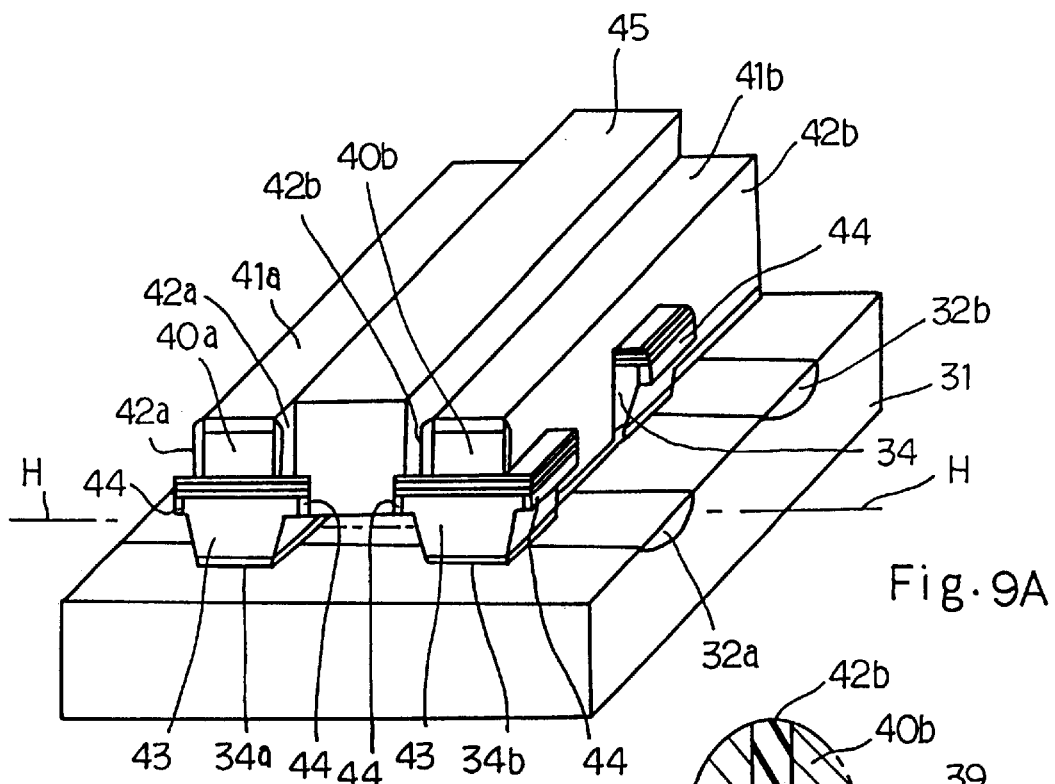
FIG. 9A is a perspective view showing still another step of the process next to the step shown in FIG. 8A.
Figure 9C:
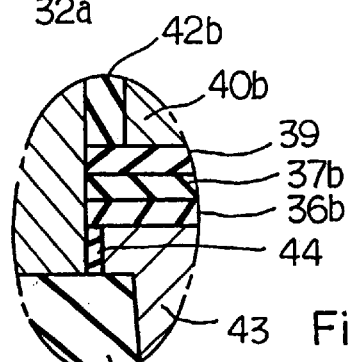
FIG. 9C is a cross sectional view showing a part of the structure encircled in broken line in FIG. 9B.
Figure 9B:
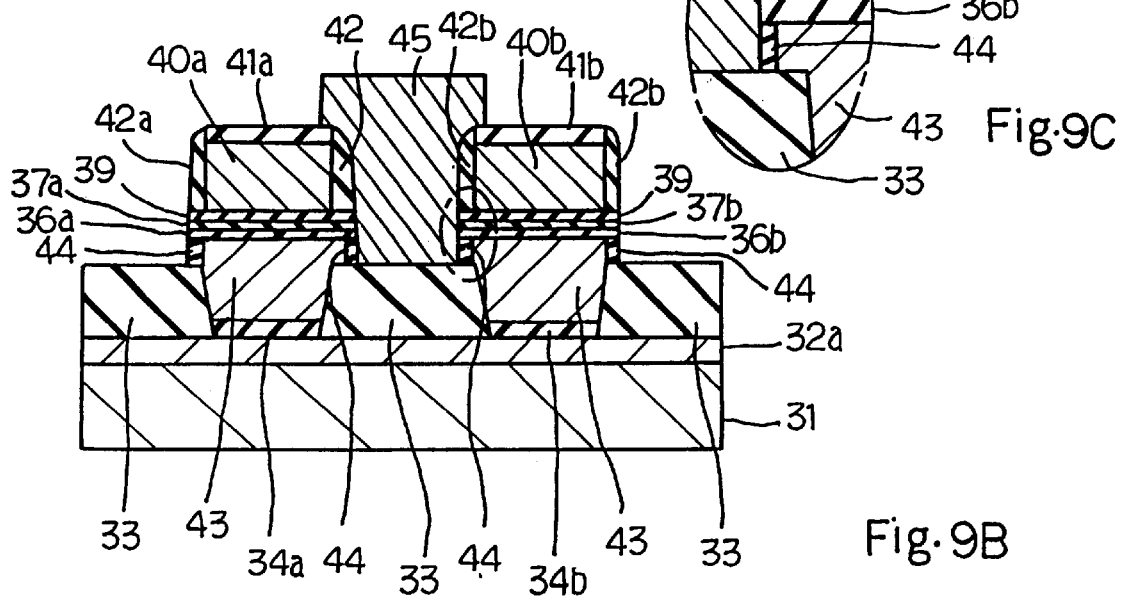
FIG. 9B is a cross sectional view taken along line H—H of FIG. 9A.

Subsequently, erase gate insulating layers and erase gate electrodes are formed as shown in FIGS. 9A, 9B and 9C.

The isolating oxide layers 33 are removed from the semiconductor structure shown in FIG. 9A for the sake of simplicity. In detail, silicon oxide is deposited to 100 nanometers thick over the entire surface of the resultant semiconductor structure, and forms a silicon oxide layer. The silicon oxide layer is anisotropically etched back without any etching mask, and side walls 42a/42b are left on the side surfaces of the polysilicon stripes 40a/40b.

The control gate insulating layers 36a/37a/39 and 36b/37b/39 are exposed to the gaps between the side walls 42a and 42b, and the control gate insulating layers 36a/37a/39 and 36b/37b/39 exposed to the gaps and the polysilicon stripes 35a/35b under the control gate insulating layers are selectively etched away until the isolating oxide layers 33 are exposed. As a result, the polysilicon stripes 35a, 35b are divided into floating gate electrodes 43. The floating gate electrodes 43 are exposed to the gaps between the isolating oxide layers 33.

The exposed surfaces of the floating gate electrodes 43 are thermally oxidized, and silicon oxide is grown to 20 nanometers thick. The silicon oxide forms the erase gate insulating layers 44 on the exposed surfaces of the floating gate electrodes 43. The thin silicon oxide layer 36b is so thin that the silicon oxide is uniformly grown, and the erase gate insulating layer 44 is substantially constant in thickness as shown in FIG. 9C.

Figure 10:
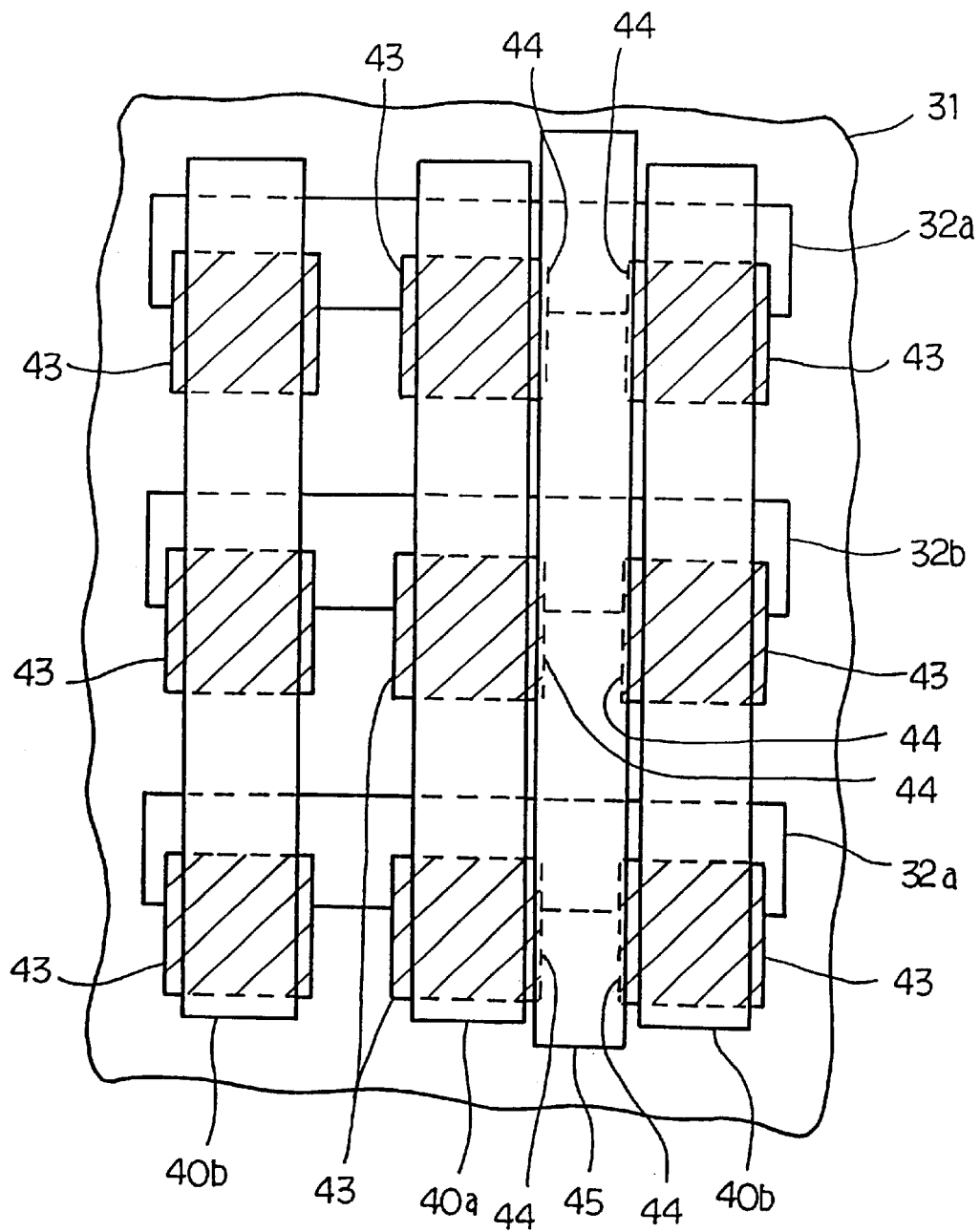
FIG. 10 is a plane view showing the layout of an electrically erasable and programmable read only memory device fabricated through the process according to the present invention.

Polysilicon is deposited to 200 nanometers thick over the entire surface of the resultant semiconductor structure, and a photo-resist etching mask (not show) is formed on the polysilicon layer. Using the photo-resist etching mask, the polysilicon layer is selectively etched away, and an erase gate electrode 45 is formed in every other gap between the side walls 42a and 42b as shown in FIG. 10. In FIG. 10, the floating gate electrodes 43 are indicated by hatching lines for easily discriminating them from other components. The erase gate electrodes 45 extend in parallel to the polysilicon stripes 40a/40b, and are shared between the floating gate electrodes 43.

Though not shown in the drawings, an inter-level insulating layer is deposited over the entire surface of the resultant semiconductor structure shown in FIGS. 9A and 9B, and contact holes are formed. Conductive lines are patterned on the inter-level insulating layer, and are held in contact through the contact holes to appropriate conductive regions.

A data bit is stored in the stacked gate type memory transistor as follows. A write voltage of 7 volts is applied to the n-type striped region 32a, and another write voltage of the order of 12 volts is applied to the control gate electrode 40b. Hot electron is injected into the floating gate electrode 43, and the stacked gate type memory transistor enters into the write-in state.

When the write-in data bit is read out from the stacked gate type memory transistor, zero volt and 1.5 volts are respectively applied to the source/drain regions or the striped n-type regions 32b/32a, and 7.5 volts are applied through the polysilicon stripe 40b to the control gate electrode 42 and the selecting gate electrode 43. If the stacked gate type memory transistor is in the erased state, a conductive channel is produced between the source region and the drain region, and electric current flows from the striped n-type region 32a to the striped n-type region 32b. The potential level on the striped n-type region 32a is lowered, and the semiconductor non-volatile memory device determines the logic level of the write-in data bit on the basis of the potential level on the striped n-type region 32a. On the other hand, if the stacked gate type memory transistor is in the write-in state, a conductive channel is not produced between the source region and the drain region, and any electric current does not flow from the striped n-type region 32a to the striped n-type region 32b. As a result, the striped n-type region 32a maintains the potential level, and the semiconductor non-volatile memory device determines the logic level of the write-in data bit on the basis of the potential level on the striped n-type region 32a.

When the accumulated electron is evacuated from the floating gate electrode 43, an erasing voltage of 18 volts is applied to the erasing gate electrode 45. Then, the accumulated electron is attracted to the erasing gate electrode 45, and the stacked gate type memory transistor enters into the erased state.

As will be appreciated from the foregoing description, the silicon oxide layers 36/39 and the silicon nitride layer 37 form a composite control gate insulating layer, and the selecting gate insulating layer is implemented by only the silicon oxide layer 39. Although the silicon oxide layer 39 is shared between the control gate insulating layer and the selecting gate insulating layer, the other silicon oxide layer 36 and the silicon nitride layer 37 are deposited only for the control gate insulating layer. For this reason, the manufacturer independently determines the thickness of the control gate insulating layer 36/37/39 and the thickness of the selecting gate insulating layer 36.

The silicon nitride layer 37 is desirable, because the silicon nitride is effective against the leakage current between the floating gate electrode 35b and the control gate electrode 42 rather than the silicon oxide layers 6/7. Even though the thickness of the control gate insulating layer 36/37/39 is thinner than the control gate insulating layer 6/7, the leakage current is decreased. The thin control gate insulating layer 36/37/39 is desirable for a miniature pattern, because the manufacturer can ignore the side etching. Thus, the silicon nitride layer 37 is desirable for the control gate insulating layer, and the control gate insulating layer 36/37/39 is advantageous over the control gate insulating layer 6/7.

Although the silicon oxide layer 39 is shared between the control gate insulating layer and the selecting gate insulating layer, the silicon oxide layer 36 and the silicon nitride layer 37 form parts of the control gate insulating layer, and allow the manufacturer to adjust the control gate insulating layer to an appropriate thickness. Thus, the process according to the present invention is advantageous over the prior art process shown in FIGS. 1A to 1E.

Moreover, the polysilicon stripes, 35a/35b, the silicon oxide layers 36a/36b and the silicon nitride layers 37a/37b are patterned by using the single photo-resist etching mask, and the single patterning step makes the process according to the present invention simple. The single photo-resist etching mask is formed through only one photo-pattern transfer from the photo mask to the photo-resist layer, and any margin is required. Thus, the single patterning step is desirable for the miniature floating gate electrodes and the control gate insulating layers.

The silicon nitride layers 37a/37b makes the total thickness of the control gate insulating layer thinner than the control gate insulating layers 6/7, and the manufacturer completes the patterning step for the silicon oxide layer, the silicon nitride layer and the floating gate electrode within t time period shorter than that of the prior arts. Thus, the silicon nitride layer is desirable for enhancing the throughput.

The silicon nitride layer 37a/37b is desirable for the uniformity of the erase gate insulating layer 44. The silicon nitride layer 44 restricts the penetration of oxygen atoms, and the silicon oxide is less grown around the boundary between the floating gate electrodes 43 and the silicon oxide layers 36a/36b. Thus, the silicon nitride layers 37a/37b restrict the growth of silicon oxide around the boundaries between the floating gate electrodes 43 and the silicon oxide layers 36a/36b, and enhance the uniformity of the erase gate insulating layers 44.

The silicon oxide layer 39 is thermally grown, and the selecting gate insulating layer grown through the thermal oxidation is thin. Thus, even though the selecting transistor is scaled down, the manufacturer can form a thin selecting gate insulating layer, and the thin selecting gate insulating layer lowers the threshold of the selecting transistor.

As will be appreciated from the foregoing description, the split gate type memory cell has the control gate insulating layer free from the leakage current and the selecting gate insulating layer thin enough to decrease the channel resistance. As a result, the manufacturer can scale down the split gate type memory cell according to the present invention. Moreover, the silicon nitride layer 37a/37b allows the manufacturer to decrease the total thickness of the control gate insulating layer without increase of the leakage current. This feature is conducive to the scale down. Finally, the erasing gate electrode 45 achieves good erasing characteristics, because the erase gate insulating layer is constant in thickness.

The process according to the present invention has the step for forming the silicon oxide layer 36a/36b and the silicon nitride layer 37a/37b on the polysilicon stripes 35a/35b before the step for thermally growing the silicon oxide layer 39. The former step allows the manufacturer to independently determine the thickness of the control gate insulating layer and the selecting gate insulating layer, and the split gate type memory cell according to the present invention is fabricated on the silicon substrate through the process. The manufacturer can scale down the split gate type memory cell by using the process, because the silicon nitride layer makes the control gate insulating layer thin, because the silicon oxide layers 36a/36b/39 and the silicon nitride layers 37a/37b are concurrently patterned. Finally, the process according to the present invention enhances the production efficiency, because the poly-silicon stripes 35a/35a, the silicon oxide layers 36a/36b and the silicon nitride layers 37a/37b are successively patterned after the single photo-lithography.

Although a particular embodiment of the present invention has been shown and described, it will be apparent to those skilled in the art that various changes and modifications may be made without departing from the spirit and scope of the present invention. The dosage, dopant impurities, the conductive materials and the gate structure are selective depending upon the device to be designed.

What is claimed is:

1. A process for fabricating a split gate type memory cell on an active region of a semiconductor substrate, comprising the steps of:
    a) forming a first impurity region and a second impurity region spaced from each other in said active region;
    b) covering a part of said first impurity region and a sub-region of said active region adjacent to said first impurity region with a first gate insulating layer;
    c) successively depositing a first conductive material, a first insulating material and silicon nitride for forming a first conductive material layer, a first insulating material layer and a silicon nitride layer on said first gate insulating layer;
    d) patterning said first conductive material layer, said first insulating material layer and said silicon nitride layer into a first conductive stripe, a first insulating sub-layer laminated on said first conductive stripe and a second insulating sub-layer laminated on said first insulating sub-layer;
    e) covering said second insulating sub-layer and another sub-region of said active region adjacent to said sub-region with a second insulating layer of a second insulating material for forming a second gate insulating layer on said first conductive stripe and a third gate insulating layer on said another sub-region;
    f) forming a second conductive stripe of a second conductive material extending over said second gate insulating layer and said third gate insulating layer for providing a control gate electrode on said second gate insulating layer and a selecting gate electrode on said third gate insulating layer; and
    g) selectively etching said first conductive stripe for forming a floating gate electrode between said first gate insulating layer and said second gate insulating layer.

2. The process as set forth in claim 1, in which said first insulating material and said second insulating material are silicon oxide.

3. The process as set forth in claim 1, in which said first conductive material and said second conductive material are polysilicon.

4. The process as set forth in claim 1, in which said first insulating material, said second insulating material and said first and second conductive materials are silicon oxide deposited through a chemical vapor deposition, silicon oxide thermally grown and polysilicon, respectively.

5. The process as set forth in claim 1, in which said step d) includes the sub-steps of
    d-1) forming a photo-resist etching mask by using a photo-lithography, and
    d-2) selectively etching said silicon nitride layer, said first insulating material layer and said first conductive material layer for forming said second insulating sub-layer, said first insulating sub-layer and said first conductive stripe.

6. The process as set forth in claim 1, in which said second insulating layer is grown through a thermal oxidation of said first conductive material and said another sub-region.

7. The process as set forth in claim 6, in which said first conductive material and said another sub-region are formed of polysilicon and single-crystal silicon, respectively.

8. The process as set forth in claim 1, further comprising the step h) of forming side insulating walls on side surfaces of said first conductive material stripe between said step d) and said step e).

9. The process as set forth in claim 1, further comprising the steps of
    h) forming a fourth gate insulating layer on a surface of said floating gate electrode exposed at said step g), and
    i) forming an erase gate electrode held in contact with said fourth gate insulating layer.

10. The process as set forth in claim 9, in which said fourth gate insulating layer is grown through a thermal oxidation of said floating gate electrode in said step h), and said second insulating sub-layer of said silicon nitride restricts the growth of said fourth gate insulating layer under a boundary between said first insulating sub-layer and said floating gate electrode so as to enhance the uniformity of the thickness of said fourth gate insulating layer.

11. The process as set forth in claim 10, in which said floating gate electrode is formed of polysilicon.

* * * * *

UNITED STATES PATENT AND TRADEMARK OFFICE
CERTIFICATE OF CORRECTION

PATENT NO.    : 6,486,507 B1
DATED         : November 26, 2002
INVENTOR(S)   : Kenji Saito It is certified that error appears in the above-identified patent and that said Letters Patent is hereby corrected as shown below:

Column 7,
Line 51, delete ""22a/32b" insert -- 32a/32b --

Column 11,
Line 41, delete "35a/35a" insert -- 35a/35b --

Signed and Sealed this

Fifteenth Day of April, 2003

JAMES E. ROGAN
*Director of the United States Patent and Trademark Office*